United States Patent
Scott

(10) Patent No.: US 6,852,828 B2
(45) Date of Patent: Feb. 8, 2005

(54) POLY AMIC ACID SYSTEM FOR POLYIMIDES

(75) Inventor: Lisa Scott, Virginia Beach, VA (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 10/075,258

(22) Filed: Feb. 15, 2002

(65) Prior Publication Data

US 2002/0120091 A1 Aug. 29, 2002

Related U.S. Application Data

(60) Provisional application No. 60/268,929, filed on Feb. 16, 2001.

(51) Int. Cl.$^7$ ................................................. C08G 73/10
(52) U.S. Cl. ........................ 528/314; 528/128; 528/176; 528/179; 528/183; 428/457; 428/458; 428/473.5; 524/600; 524/606
(58) Field of Search ................................. 528/314, 128, 528/183, 176, 179, 125, 126, 170–173; 428/457–458, 473.5; 524/600, 606

(56) References Cited

U.S. PATENT DOCUMENTS

| | | | | |
|---|---|---|---|---|
| 5,177,181 A | * | 1/1993 | Rosenfeld et al. | 528/353 |
| 6,010,791 A | * | 1/2000 | Tan et al. | 428/451 |
| 6,133,408 A | * | 10/2000 | Chiu et al. | 528/353 |

* cited by examiner

*Primary Examiner*—James J. Seidleck
*Assistant Examiner*—Melanie Bissett
(74) *Attorney, Agent, or Firm*—Michael C. Soldner; Girma Wolde-Michael

(57) ABSTRACT

A poly amic acid precursor containing a combination of tetrahydrofuran and N-methylpyrrolidinone as cosolvents is described. Utilizing the combination of tetrahydrofuran and N-methylpyrrolidinone allows for the removal of significant portions of the solvent during the formation of the polyimide. The removal of tetrahydrofuran and N-methylpyrrolidinone can be done without the use of preheating zones so as to allow for the large scale production of polyimide articles.

14 Claims, No Drawings

US 6,852,828 B2

1

POLY AMIC ACID SYSTEM FOR POLYIMIDES

The present application is based on U.S. Provisional Application No. 60/268,929, filed Feb. 16, 2002, herein incorporated by reference in its entirety.

FIELD OF THE INVENTION

The present invention is directed to a poly amic acid system for polyimides. More particularly, the invention is directed to a poly amic acid solution in a cosolvent blend that is easily removed during the formation of the polyimide.

BACKGROUND OF THE INVENTION

Polyimides have proven valuable in the formation of flexible printed circuits. Flexible printed circuits can significantly reduce the weight of the electronics making them important in the portable electronics industry. Flexible printed circuits also reduce the costs associated with assembling the electronics package by reducing the assembly operation and allows for testing of the circuits prior to further assembly.

Typically, a flexible printed circuit is a laminated material that consists of a dielectric layer and a conductor layer. A copper foil is often used as the conductor layer and a polyimide layer is often used for the dielectric layer.

The polyimide is typically processed from a poly amic acid precursor to form a thin film or a coating cast onto the copper film. The poly amic acid precursor is typically in an organic solvent such as N-methylpyrrolidinone (NMP). However, processing on a large scale production line requires that the solvent be removed at rate much faster than what can be achieved when using NMP as a solvent. Some efforts have involved adding xylenes to NMP to facilitate solvent removal. Solvent removal for the xylene/NMP system is not rapid enough to be utilized on a large scale production line.

Other efforts have employed a solvent system containing acetone. This method requires the use of a preheater in gradual heating regimes to remove a significant portion of the solvent prior to forming the polyimide layer.

SUMMARY OF THE INVENTION

An object of the present invention is to provide a poly amic acid precursor that can be utilized in a large scale production line such that the solvent in the poly amic acid precursor may be easily removed.

The present invention is directed to a poly amic acid precursor that includes at least one diamine and at least one dianhydride in a cosolvent blend of tetrahydrofuran (THF) and NMP. The tetrahydrofuran may be in an amount ranging from about 1% to about 90% by volume of tetrahydrofuran and N-methylpyrrolidinone. Further, the tetrahydrofuran may be in an amount ranging from about 60% to about 90% by volume of tetrahydrofuran and N-methylpyrrolidinone. The at least one anhydride may include a combination of 4,4'-oxydiphthalic anhydride and 3,3',4,4'-biphenyltetracarboxylic dianhydride. In a preferred embodiment, the mole ratio of 3,3',4,4'-biphenyltetracarboxylic dianhydride to 4,4'-oxydiphthalic anhydride may range from about 25% to about 75% 3,3',4,4'-biphenyltetracarboxylic dianhydride. In yet another preferred embodiment, the mole ratio of 3,3',4,4'-biphenyltetracarboxylic dianhydride to 4,4'-oxydiphthalic anhydride may be about 50% 3,3',4,4'-biphenyltetracarboxylic dianhydride. The diamine in the poly amic acid precursor may include 3,4'-oxydianiline.

The poly amic acid precursor may include at least 1 weight % of an inorganic filler selected from the group consisting of mica, silica, calcium carbonate, calcium phosphate, calcium silicate, talc, and a combination thereof.

In one embodiment, the present invention includes a polyamic acid precursor comprising 3,3',4,4'-biphenyltetracarboxylic dianhydride and 4,4'-oxydiphthalic anhydride in a molar ratio of about 50% to a solution of 3,4'-oxydianiline and a cosolvent comprising about 70% tetrahydrofuran and about 30% N-methylpyrrolidinone by volume of cosolvent. The 3,4'-oxydianiline may be in a molar ratio of about 50% to 3,3',4,4'-biphenyltetracarboxylic dianhydride and 4,4'-oxydiphthalic anhydride.

The present invention also includes a method for producing a polyimide. The method includes heating a poly amic acid precursor comprising at least one anhydride and at least one diamine in a cosolvent of tetrahydrofuran and N-methylpyrrolidinone, wherein said tetrahydrofuran is in an amount ranging from about 1% to about 90% by volume of tetrahydrofuran and N-methylpyrrolidinone, whereby a portion of the cosolvent is removed and a polyimide is formed. The method may also include adding at least 1 weight % of an inorganic filler selected from the group consisting of mica, silica, calcium carbonate, calcium phosphate, calcium silicate, talc, and a combination thereof to said poly amic acid precursor. In a preferred embodiment, the at least one anhydride may be 4,4'-oxydiphthalic anhydride and 3,3',4,4'-biphenyltetracarboxylic dianhydride and the mole ratio of 3,3',4,4'-biphenyltetracarboxylic dianhydride to 4,4'-oxydiphthalic anhydride may range from about 25% to about 75% 3,3',4,4'-biphenyltetracarboxylic dianhydride. Still further, the diamine may be 3,4'-oxydianiline.

The invention also includes a polyimide laminate. The polyimide laminate includes a polyimide layer and a metal foil. The polyimide laminate is produced by casting a polyamic acid precursor comprising at least one diamine and at least one anhydride in a cosolvent of tetrahydrofuran and N-methylpyrrolidinone onto a surface of the metal foil, followed by heating the polyamic acid solution to form the polyimide layer. The poly amic acid precursor preferably contains an amount of tetrahydrofuran ranging from about 1% to about 90% by volume of solvent of tetrahydrofuran and N-methylpyrrolidinone. The polyamic acid precursor may include at least 1 weight % of an inorganic filler selected from the group consisting of mica, silica, calcium carbonate, calcium phosphate, calcium silicate, talc, and a combination thereof. The at least one anhydride may include 4,4'-oxydiphthalic anhydride and 3,3',4,4'-biphenyltetracarboxylic dianhydride. The mole ratio of 3,3',4,4'-biphenyltetracarboxylic dianhydride to 4,4'-oxydiphthalic anhydride may range from about 25% to about 75% 3,3',4,4'-biphenyltetracarboxylic dianhydride. In a preferred embodiment, the mole ratio of 3,3',4,4'-biphenyltetracarboxylic dianhydride to 4,4'-oxydiphthalic anhydride is about 50% 3,3',4,4'-biphenyltetracarboxylic dianhydride. The diamine may include 3,4'-oxydianiline. Still further, the poly amic acid precursor may be quantitatively pumped and fed through a slit die and cast onto a surface of a metal foil. In one preferred embodiment, the metal foil is copper.

Still further, the invention includes a process for producing a polyimide laminate. The method includes adding a poly amic acid precursor onto a surface of a substrate, wherein the polyamic acid precursor comprises at least one diamine and at least one anhydride in a cosolvent of tetrahydrofuran and N-methylpyrrolidinone, wherein said tetrahydrofuran is in an amount ranging from about 1% to about 90% by volume of tetrahydrofuran and N-methylpyrrolidinone and heating the poly amic acid precursor on the substrate to remove tetrahydrofuran and N-methylpyrrolidinone therby forming a polyimide laminate. Preferably, the tetrahydrofuran is an amount ranging from about 10% to about 90% tetrahydrofuran by volume of tetrahydrofuran and N-methylpyrrolidinone. In one embodiment, the poly amic acid precursor contains about 90% tetrahydrofuran and about 10% N-methylpyrrolidinone. The method may also include a step of heating the poly amic acid precursor solution to remove at least about 75% of the solvent.

DETAILED DESCRIPTION OF THE INVENTION

A poly amic acid solution in a cosolvent blend of THF and NMP to form a poly amic acid precursor is described in detail. The resulting precursor is ideal for roll-to-roll manufacturing of flexible printed circuit (FPC) laminates. The addition of the THF to the organic solvent NMP facilitates the manufacturing process and lends this material to rapid production. Removal of cosolvent is done through variable heating zones to produce a laminate with a smooth surface. Volatile retention using the cosolvent blend is about 1–3% compared to 33–35% when 100% NMP is used as the solvent under identical processing conditions. The low retention of solvent in the polyimide product reduced the manufacturing costs for the product because additional secondary processing steps to remove additional solvent are not required.

According to the present invention, at least one diamine and at least one anhydride is provided in a cosolvent system of THF and NMP to form a poly amic acid precursor. The poly amic acid precursor forms a polyimide when heated and loses solvent at a rate sufficient to be utilized in a large scale production line without the need for a preheater. The poly amic acid precursor is especially useful for forming a polyimide layer on a metal foil in the production of a flexible printed circuit.

The anhydride used for the poly amic acid precursor may be any anhydride suitable for forming a polyimide. Examples of suitable anhydrides include, but are not limited to 3,3',4,4'-biphenyltetracarboxylic dianhydride (BPDA), 4,4'-oxydiphthalic anhydride (ODPA), 3,3',4,4'-benzophenonetetracarboxylic acid dianhydride (BTDA), pyromellitic dianhydride (PMDA), 3,3',4,4'-diphenylsulfonetetracarboxylic acid dianhydride (DSDA), and combination thereof. The present invention may include the use of one anhydride or a combination of two or more anhydrides. Copolyimides are typically formed by utilizing two or more anhydrides in the poly amic acid precursor. As used herein, "polyimide" includes both polyimides and copolyimides.

The diamines that may be used in the poly amic acid precursor are not particularly limited. Any diamine suitable for the preparation of a polyimide may be used. Examples of suitable diamines include, but are not limited to, 3,4'-oxydianiline (ODA), 4,4'-oxybisbenzenamine, m-phenylenediamine (m-PDA), p-Phenylenediamine (p-PDA), diaminodiphenyl sulfone (DDS), diaminobenzophenone, N,N'-diphenylmethylenediamine, and combinations thereof. The diamines may be used individually or in combination with two or more diamines.

Alternatively, diisocyanates such as 3,4'-oxydiisocyanate may be used with the above listed anhydrides to form a poly amic acid precursor. The ratio of diamine to anhydride is not particularly critical and is dependent on the desired properties of the resulting polyimide. While the ratio of diamine to anhydride can vary widely, in one embodiment, the ratio of diamine to anhydride is 50:50.

A wide variety of combinations of anhydrides and diamines or diisocyanates may be used in accordance with the present invention. Typically the combination of anhydride and diamine is selected based on the desired physical, chemical, and thermal properties for the resulting polyimide. Exemplary combinations of anhydrides and diamines or diisocyanates for the poly amic acid precursor include, but are not limited to, BPDA and ODPA with ODA, and BPDA and ODPA with 3,4'-oxydiisocyanate.

With the above exemplary combinations, the preferred ratio of ODPA to BPDA ranges from about 75 mol % ODPA and 25 mol % BPDA to about 25 mol % ODPA and 75 mol % BPDA. Most preferably, the mole ratio of ODPA to BPDA is 50 mol % ODPA and 50 mol % BPDA.

The cosolvent system used in the poly amic acid precursor includes a combination of tetrahydrofuran (THF) and N-methylpyrrolidinone (NMP). THF is desirable as the cosolvent due to its low boiling point of 66° C., which allows for rapid removal of the solvent during roll-to-roll production. The resulting poly amic acid is dried to about 99% volatile free producing a laminate that is useful as an adhesive in FPC.

The cosolvent system may range from about 1% to about 90% THF by volume of the solvent. Preferably, the cosolvent system contains THF ranging from about 10% to about 90% by volume of the solvent. Most preferrably, the cosolvent system contains THF ranging from about 60% to about 90% by volume of the solvent. In one embodiment, 80% THF is used and in another embodiment 70% THF is used. Using the cosolvent system in accordance with the present invention allows for the removal of about 75% of solvent down to about 1–3% of the cosolvent in the finished polyimide. In one embodiment, 97–99% of the solvent is removed from the finished polyimide.

In order to control the molecular weight of the polyimides, the stoichiometry may be offset and the polyimide may be terminated with an endcapper such as a monofunctional anhydride or a mono functional amine. A preferred endcapper is phthalic anhydride. Other endcappers include, but are not limited to, maleic anhydride, phenylethynyl anhydride, ethynyl anhydride, nadic anhydride, vinylic anhydride, allylic anhydride, benzocyclobutane anhydride, phenylethynyl amine, ethynylaniline, vinylaniline, and allylaniline. The endcapper may be added to the polyimide at an amount ranging from about 2 mole percent to about 10 mole percent depending on the desired properties of the polyimide.

To form the polyimide, the poly amic acid precursor is heated to a temperature high enough to form the polyimide and to drive off the solvent. In one embodiment, the polyamic acid precursor is heated to about 200° C. The temperature may vary depending on the anhydrides and diamines being used and the ratio of THF to NMP.

The poly amic acid precursor may be applied to a substrate followed by heating to form the polyimide and drive off the solvent. The techniques for applying poly amic acid precursor to substrates are well known to those skilled in the art. Substrates may include, but are not limited to, metals, plastics, glass, and the like.

Polyimide laminates may be produced by casting the poly amic acid precursor onto a metal foil such as copper foil and heating the poly amic acid precursor to produce a polyimide laminate. The poly amic acid precursor may be cast from a slit die onto the copper foil. The poly amic acid precursor may be cast onto a metal foil in succession to produce a polyimide roll clad used in FPC roll-to-roll manufacturing. Further, the poly amic acid precursor may be cast onto a continuously fed copper foil by quantitatively pumping through a slit die by an extrusion means. These described methods, and their variations are well known to one skilled in the art.

The cosolvent in the poly amic acid precursor is removed by heating to about 200° C. The heating may be performed in one location or in variable heating zones during the manufacturing process. In this way, about 75% to about 99% of the solvent may be removed from the resulting polyimide resin.

Fillers may be added to the poly amic acid precursor of the present invention to modify the poly amic acid precursor and resulting polyimide properties. Examples of fillers, include, but are not limited to, graphite, ceramic, metal, plastic, copper, iron, diamond dust, polyimide powder, boron, aluminum, chopped carbon fibers, mica, silica, calcium carbonate, calcium phosphate, calcium silicate, and talc.

The present invention is illustrated in the following examples. The examples are provided for illustrating various embodiments of the present invention and should not be construed as limiting the scope of the present invention.

EXAMPLE 1

Poly amic acid powder (1 g) was dissolved in a cosolvent blend of THF (4 g) and NMP (6 g). The ratio was increased to a maximum of 90% by weight of THF combined with 10% by weight of NMP. The solution was placed on a stir plate and left at room temperature to stir overnight. The cosolvent blend produced a homogeneous solution that remained homogeneous over a period of 24 hours at room temperature. Storage of the poly amic acid for 6 months in refrigeration, using the cosolvent system, has resulted in the solution remaining homogeneous. The poly amic acid precursor was cast from the cosolvent blend onto copper foil and dried to afford the final polyimide laminate. The residual solvent retentions were about 1–3% when dried using conventional mass production equipment.

EXAMPLE 2

Poly amic acid powder (1 g) was dissolved in separate cosolvent blends of methylethyl ketone (MEK) (5 g)/NMP (5 g) and Acetone (4 g)/NMP (6 g). The polymer precipitated out of both the MEK/NMP cosolvent blend and the Acetone/NMP cosolvent blend. Further, poly amic acid powder (1 g) was dissolved in separate cosolvent blends of methoxyethyl ether (MEE) (4 g)/NMP (6 g) and Toluene (4 g)/NMP (6 g). In both the MEE/NMP cosolvent blend and the Toluene/NMP solvent blend the polymer turned to gel and produced a cloudy appearance. The cosolvents described above produced nonhomogeneous solutions.

EXAMPLE 3

Poly amic acid powder was dissolved in 100% (wt) NMP. The solvent produced a homogeneous solution. The poly amic acid precursor was cast from the solvent onto copper foil and dried to afford the final polyimide laminate. The residual solvent retentions were about 30–35% when dried using conventional mass production equipment. Repeating the drying schedule reduced the solvent retention to about 28% resulting in the need for a secondary processing stage to remove the solvent.

It will be readily understood by those persons skilled in the art that the present invention is susceptible to broad utility and application. Many embodiments and adaptations of the present invention other than those herein described, as well as many variations, modifications and equivalent arrangement, will be apparent from or reasonably suggested by the present invention and the foregoing description without departing from the substance or scope of the present invention.

Accordingly, while the present invention has been described in detail in relation to its preferred embodiment, it is to be understood that this disclosure is only illustrative and exemplary of the present invention and is made merely for purposes of providing a full and enabling disclosure of the invention. The foregoing disclosure is not intended to be construed to limit the present invention or otherwise exclude any other embodiments, adaptations, variations, modifications or equivalent arrangements, the present invention being limited only by the claims and the equivalents thereof.

What is claimed is:

1. A poly amic acid precursor comprising at least one anhydride and at least one diamine in a cosolvent of tetrahydrofuran arid N-methylpyrrolidinone, wherein said tetrahydrofuran is in an amount ranging from about 60% to about 90% by volume of tetrahydrofuran and N-methylpyrrolidinone.

2. The poly amic acid precursor of claim 1 wherein said at least one anhydride is a combination of 4,4'-oxydiphthalic anhydride, and 3,3',4,4'-biphenyltetracarboxylic dianhydride.

3. The poly amic acid precursor of claim 2 wherein the mole ratio of 3,3'4,4'-biphenyltetraarboxylic dianhydride to 4,4'-oxydiphthalic anhydride ranges from about 25% to about 75% 3,3',4,4'-biphenyltetracarboxylic dianhydride.

4. The poly amic acid precursor of claim 2 wherein the mole ratio of 3,3',4,4'-biphenyltetracarboxylic dianhydride to 4,4'-oxydiphthalic anhydride is about 50% 3,3',4,4'-biphenyltetracarboxylic dianhydride.

5. The poly amic acid precursor of claim 1 wherein the diamine is 3,4'-oxydianiline.

6. The poly amic acid precursor of claim 1 further comprising at least 1 weight % of an inorganic filter selected from the group consisting of mica, silica, calcium carbonate, calcium phosphate, calcium silicate, talc, and a combination thereof.

7. A polyamic acid precursor comprising:
   3,3',4,4'-biphenyltetracarboxylic dianhydride and 4,4'-oxydiphthalic anhydride in a molar ratio of about 50% 3,3',4,4'-biphenyltetracarboxylic dianhydride;
   3,4'-oxydianiline in a molar ratio of about 50%, 3,4'-oxydianiline to 3,3',4,4'-biphenyltetracarboxylic dianhydride and 4,4'-oxydiphthalic anhydride; and
   a cosolvent comprising about 70% tetrahydrofuran and about 30% N-methylpyrrolidinone by volume of cosolvent.

8. A method for producing a polyimide comprising:
   heating a poly amic acid precursor comprising at least one anhydride and at least one diamine in a cosolvent of tetrahydrofuran and N-methylpyrrolidinone, wherein said tetrahydrofuran is in an amount ranging from about 60% to about 90% by volume of tetrahydrofuran and N-methylpyrrolidinone, whereby a portion of the cosolvent is removed and a polyimide is formed.

9. The method of claim 8 further comprising adding at least 1 weight % of an inorganic filler selected from the group consisting of mica, silica, calcium carbonate, calcium phosphate, calcium silicate, talc, and a combination thereof to said poly amic acid precursor.

10. The method of claim 8 wherein the at least one anhydride is 4,4'-oxydiphthalic anhydride and 3,3',4,4'-biphenyltetracarboxylic dianhydride and the mole ratio of 3,3',4,4'-biphenyltetracarboxylic dianhydride to 4,4'-oxydiphthalic anhydride ranges from about 25% to about 75% 3,3',4,4'-biphenyltetracarboxylic dianhydride.

11. The method of claim 8 wherein the diamine is 3,4'-oxydianiline.

12. A process for producing a polyimide laminate comprising the steps of:

adding a poly amic acid precursor onto a surface of a substrate, wherein the polyamic acid precursor comprises at least one diamine and at least one anhydride in a cosolvent of tetrahydrofuran and N-methylpyrrolidinone, wherein said tetrahydrofuran is in an amount ranging from about 60% to about 90% by volume of tetrahydrofuran and N-methylpyrrolidinone; and heating the poly amic acid precursor on the substrate to remove a tetrahydrofuran and N-methylpyrrolidinone thereby forming a polyimide laminate.

13. The process of claim 12 wherein the poly amic acid precursor contains about 90% tetrahydrofuran and about 10% N-methylpyrrolidinone.

14. The process of claim 12 wherein the step of heating the poly amic acid precursor solution removes at least about 75% of the solvent.

* * * * *

UNITED STATES PATENT AND TRADEMARK OFFICE
CERTIFICATE OF CORRECTION

| | | |
|---|---|---|
| PATENT NO. | : 6,852,828 B2 | Page 1 of 1 |
| APPLICATION NO. | : 10/075258 | |
| DATED | : February 8, 2005 | |
| INVENTOR(S) | : Lisa Scott | |

It is certified that error appears in the above-identified patent and that said Letters Patent is hereby corrected as shown below:

Column 6, lines 27 and 28, please delete "tetrahydrofuran arid" and insert --tetrahydrofuran and--

Column 6, line 47, please delete "inorganic filter" and insert --inorganic filler--

Signed and Sealed this

Twenty-sixth Day of December, 2006

JON W. DUDAS
*Director of the United States Patent and Trademark Office*